United States Patent [19]

Shrote

[11] Patent Number: 5,774,358
[45] Date of Patent: Jun. 30, 1998

[54] METHOD AND APPARATUS FOR GENERATING INSTRUCTION/DATA STREAMS EMPLOYED TO VERIFY HARDWARE IMPLEMENTATIONS OF INTEGRATED CIRCUIT DESIGNS

[75] Inventor: Curtis K. Shrote, Austin, Tex.

[73] Assignee: Motorola, Inc., Schaumburg, Ill.

[21] Appl. No.: 625,153

[22] Filed: Apr. 1, 1996

[51] Int. Cl.$^6$ .............................. G06F 15/60; G05B 19/42
[52] U.S. Cl. .......................... 364/191; 364/488; 364/490; 364/578; 364/184; 371/27
[58] Field of Search ........................ 364/468, 28, 468.03, 364/468.04, 191, 192, 490, 491, 488, 184, 578, 579; 371/550, 15.1, 16.1, 21; 395/183.13

[56] References Cited

U.S. PATENT DOCUMENTS

| | | | |
|---|---|---|---|
| 5,089,973 | 2/1992 | Furtek | 364/489 |
| 5,422,833 | 6/1995 | Kelem et al. | 364/578 |
| 5,455,938 | 10/1995 | Ahmed | 364/488 |
| 5,497,334 | 3/1996 | Russell et al. | 364/489 |
| 5,572,437 | 11/1996 | Rostoker et al. | 364/489 |

*Primary Examiner*—Paul P. Gordon
*Attorney, Agent, or Firm*—Keith E. Witek

[57] ABSTRACT

A system (200) for generating an instruction/data stream (214) used to verify a hardware implementation of an integrated circuit design with respect to a higher level implementation. Upon execution, the instruction/data stream (214) causes boundary conditions, system events, interrupts, and exceptions of interest to be verified within the hardware implementation. In constructing the instruction/data stream (214), the system (200) receives (102) a plurality of templates (216) that describe partial behaviors of the integrated circuit design corresponding particular instructions. The system (200) then receives (104) a plurality of register models describe an operation of registers within the integrated circuit design. The system (200) then receives (106) a plurality of exception events that correspond to a potentially problematic operation of the hardware implementation. The system (200) then processes the plurality of templates, the plurality of register models, and the plurality of exception events to produce the instruction/data stream (214). The system (200) may also receive system element behavior (306) and process the system element behavior to validate operations of the hardware implementation for corresponding system elements.

20 Claims, 6 Drawing Sheets

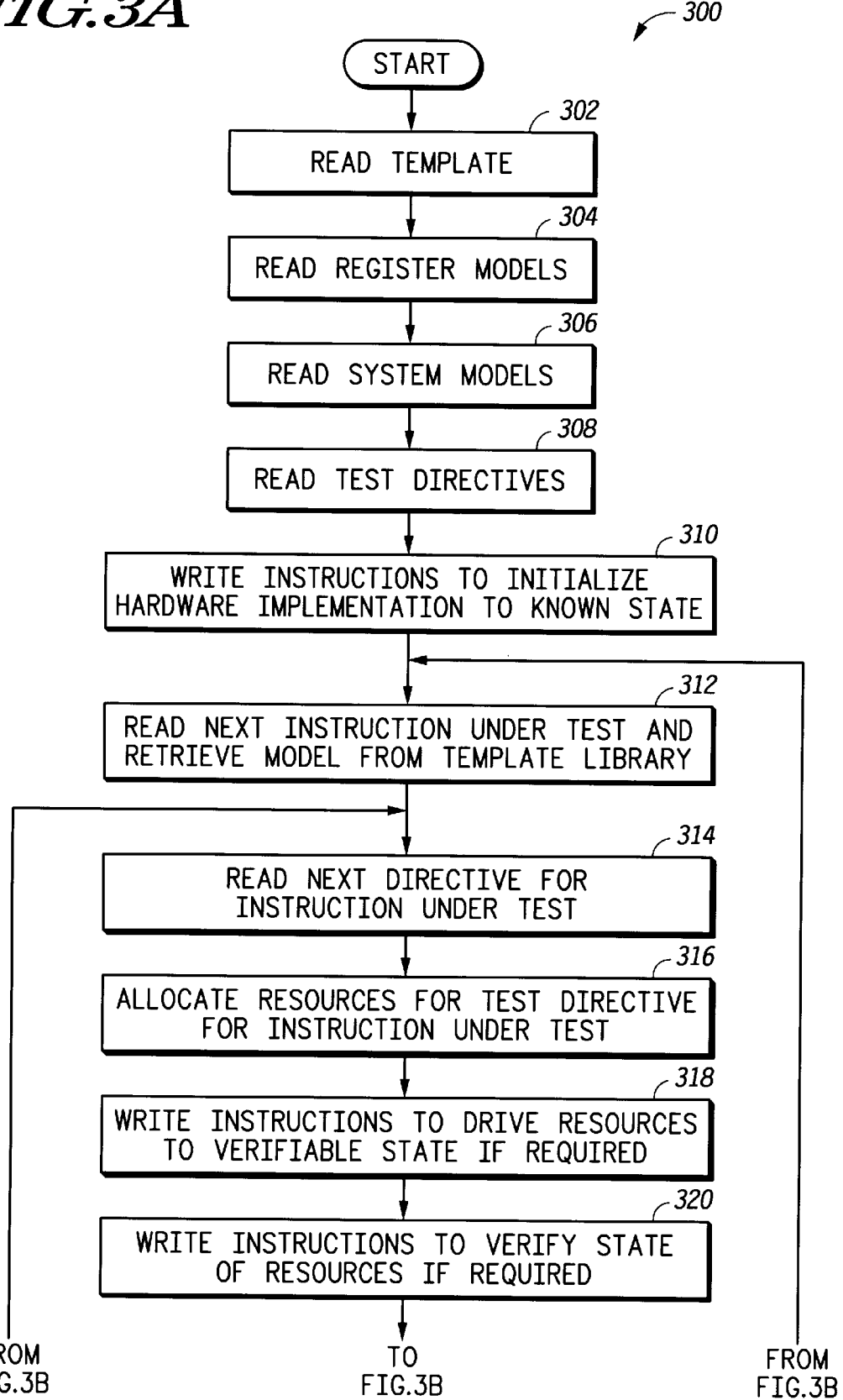

METHOD AND APPARATUS FOR GENERATING INSTRUCTION/DATA STREAMS EMPLOYED TO VERIFY HARDWARE IMPLEMENTATIONS OF INTEGRATED CIRCUIT DESIGNS

TECHNICAL FIELD OF THE INVENTION

This invention relates generally to the testing of integrated circuit designs and more specifically to the generation of an instruction/data stream which may be employed to verify a hardware implementation of an integrated circuit design with respect to a higher level implementation of the integrated circuit design.

BACKGROUND OF THE INVENTION

With the great increase in complexity of integrated circuit designs over the years, the necessity of verifying particular levels of the design has become important. In a typical integrated circuit design procedure, the integrated circuit design is first created in a high level design language such as Verilog™, the high-level software language C, VHDL™, Mentor Graphics™ M code, or other language intended to characterize, at a high level, behavior of integrated circuits. Once the Integrated circuit design has been completed in the higher level language, the high level representation is compiled or re-written to produce a behavioral model in a lower level language or at a lower level of abstraction, such as a register transfer level model (RTL). From the RTL implementation of the integrated circuit design, the design is compiled again to a still lower level design, typically a gate level schematic representation of the integrated circuit design. From the gate level schematic representation, the design may then be converted to a custom layout design using standard cells to implement the gates within the gate level schematic of the integrated circuit design. The standard cells are then interconnected as required to implement the logic of the integrated circuit design and also to make the external connections. Based upon the standard cell design, a physical design file is created which is then converted into a set of masks used in the process of constructing an actual integrated circuit. Thus, the progression of the integrated circuit design from the highest level to an actual physical implementation employs a number of conversion steps.

One particular conversion step of interest is the step from the highest level implementation of the integrated circuit design to a hardware implementation of the integrated circuit design. This particular conversion takes the higher level behavioral characteristics of the integrated circuit and implements these characteristics in a logical hardware implementation. An error introduced in the conversion step is retained in all further implementations of the design. Thus, it is important to verify the hardware implementation with respect to the highest level representation of the integrated circuit design.

Tools have been available to at least partially verify a hardware implementation of an integrated circuit design. However, none of these tools effectively tested the hardware implementation. One particular prior art tool designed to verify a hardware implementation of an integrated circuit is described in Technical Report 88.290, published in July 1990 by IBM Science and Technology, IBM Israel and entitled *RTPG—A DYNAMIC BIASED PSEUDO—RANDOM TEST PROGRAM GENERATOR FOR PROCESSOR VERIFICATION*. ("The IBM program"). The IBM program implemented a procedure for generating test code that at least partially verified the operation of a lower level implementation of the integrated circuit design. The IBM program, however, suffered a number of shortcomings.

Because the IBM program used an architecture level reference model to generate expected results that were cross referenced with results obtained when executing the test code, the cross referencing that could be performed did not fully test the accuracy of all lower level implementations. The reference model used by the IBM Israel program to generate executable code and expected results was non-dynamic and was not readily transportable to from one architecture to another architecture. The ability of the IBM Israel program to investigate the operation of complex boundary, exception, and interrupt conditions was limited due to the high level implementation of its reference model. Therefore, the IBM program did not verify fully particular hardware implementations under test but statistically generated instructions that generally tested the operation of the hardware implementation. Particular sequences of interest relating to the specific hardware implementation could not be generated by the IBM program.

The IBM program suffered from implementation deficiencies as well. For each particular code segment generated by the IBM program that performed verification testing on a small portion of a design, instructions had to be included to drive the hardware implementation under test to a known, or initialized state and then to verify the machine state upon completion. The IBM program used an initialization technique whereby load instructions initialized the machine to a known state, the load instructions destroying the machine state. Thus, all information relating to machine state had to be verified prior to the initialization sequence. After initialization, test instructions were then executed. Then, the results were verified using load/compare instruction sequences. The load/compare sequence also destroyed the machine state. Thus, after each particular segment tested, the machine again had to be initialized. Significant resources were consumed using this tedious re-initialization process.

Thus, there exists a need in the art for a method and associated apparatus for generating exhaustive verification instructions that will verify operation of a lower level integrated circuit design with respect to a high level implementation of the integrated circuit design.

BRIEF DESCRIPTION OF THE DRAWINGS

FIG. 3a is a logic diagram illustrating a first portion of a method for generating instructions used to verify a hardware implementation of an integrated circuit design in accordance with the present invention;

DETAILED DESCRIPTION OF DRAWINGS

The present invention relates to a method and associated apparatus for generating an instruction/data stream used to verify a hardware or another implementation of an integrated circuit design capable of executing the instructions. The instructions generated through the method of the present invention, systematically and thoroughly investigate boundary conditions, interrupts, and exceptions of interest to the particular hardware implementation of the integrated circuit design. The method commences with a first step of receiving a plurality of templates. Each of the templates describes at least a partial behavior of the integrated circuit design upon receipt of a respective instruction. Next the method of the present invention includes receiving a plurality of register models. Each of the register models describes the operation of particular registers within the integrated circuit design. The method next includes receiving a plurality of exception events. Each of the exception events corresponds to a potentially problematic operation of the hardware implementation of the integrated circuit design. Finally, the method includes processing the plurality of templates, the plurality of register models, and the plurality of exception events to produce the instruction/data stream. The instruction/data stream includes a plurality of instructions that, when executed by the hardware implementation, verify results generated by the hardware implementation against expected results. Thus, the instruction/data stream includes not only instructions that cause a particular operation of the hardware implementation, but that initialize the hardware implementation, that cause the hardware implementation to reach specific, predefined states, and that cause the hardware implementation to compare states or signatures of the hardware implementation with expected states or signatures. In this fashion, the instruction/data stream generated by the present invention itself causes the verification of the hardware implementation.

Figure 1:
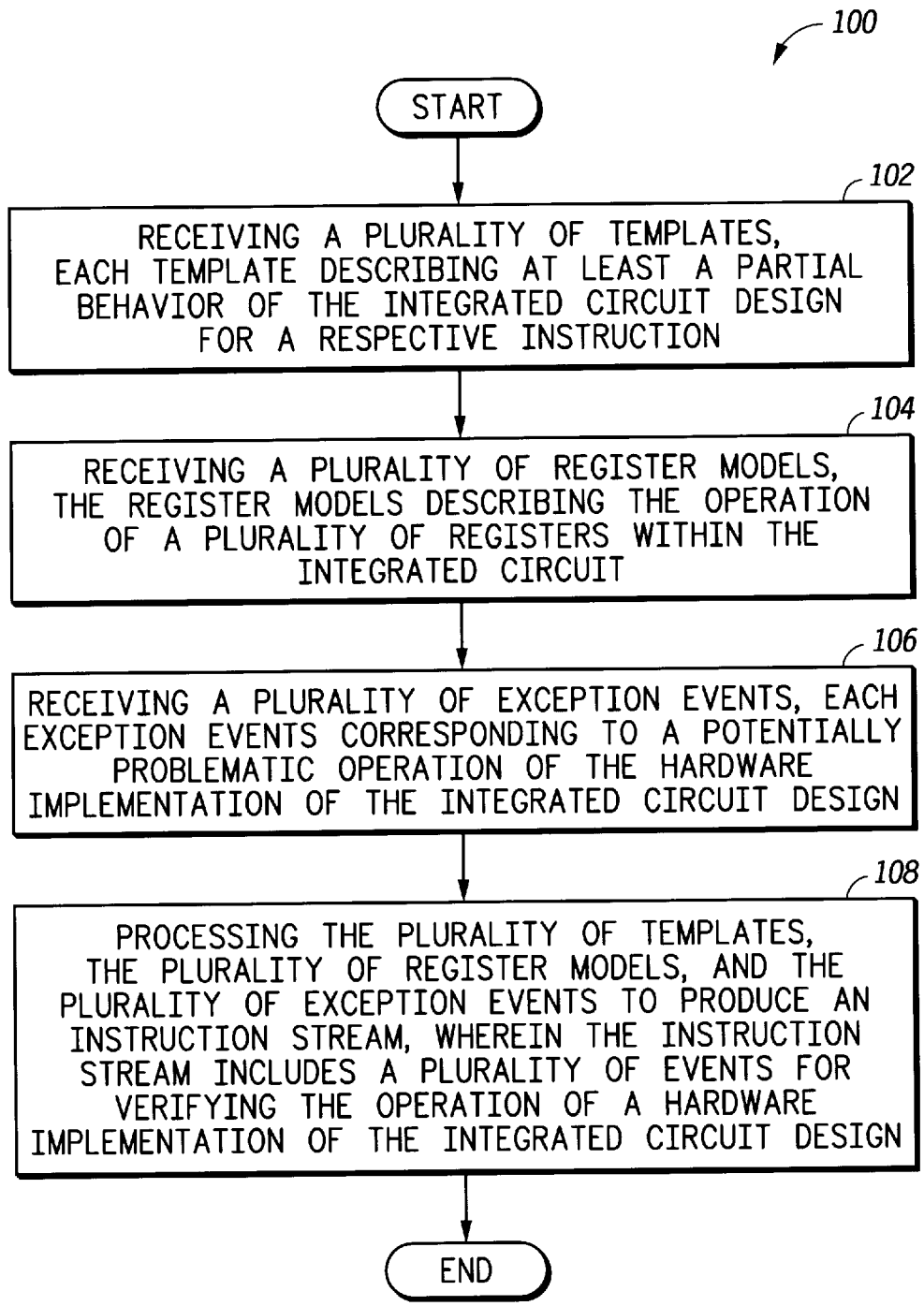
FIG. 1 is a logic diagram illustrating a method for generating an instruction/data stream used to verify a hardware implementation of an integrated circuit design in accordance with the present invention.

FIG. 1 illustrates a method 100 for generating an instruction/data stream used to verify a hardware implementation of an integrated circuit design in accordance with the present invention. Method 100 commences at step 102 of receiving a plurality of templates. Each of the plurality of templates describes at least a partial behavior of the integrated circuit design for a respective instruction. Each of the templates preferably corresponds to an instruction executable by a pipeline or execution unit within the integrated circuit design. Each template includes at least one logical formula describing the results produced through the execution of the respective instruction. Such formulas describe how storage devices, such as registers are affected by the execution, and relates any resultant values that are produced. Each template preferably also includes an equation that describes the effect of an execution of the respective instruction on the program counter of the integrated circuit. Each of the templates also includes boundary conditions and pipeline sequence events of interest for the particular instruction associated with the template. Such information is specific to the particular hardware implementation and relates those conditions that may be problematic for the particular hardware implementation during execution.

From step 102 the method proceeds to step 104 of receiving a plurality of register models. The plurality of register models describe the operation of a plurality of registers within the integrated circuit design. Preferably, the plurality of registers include system registers and general registers. The system registers are those registers, such as the program counter and method status register, which are not accessible except during a supervisory mode. Alternatively, the general registers are those registers that are accessible by a user for the execution of software. Of course, depending upon the particular integrated circuit design, some of the system registers may also be accessible via software instruction by a user while others may not even be accessible in supervisory mode. The register models define the various attributes of the registers such as size, behavior during overflow, volatility, behavior during various reset modes, and other characteristics.

From step 104, the method proceeds to step 106 of receiving a plurality of exception and interrupt events. Each of the plurality of exception and interrupt events corresponds to a potentially problematic operation of the hardware implementation of the integrated circuit design. Because the hardware implementation of the integrated circuit design has its own limitations associated with its logical implementation, the limitations must be investigated. The plurality of exception and interrupt events are provided by a designer of the integrated circuit design who understands how the particular hardware implementation may be limited during particular operations of the integrated circuit. Exception and interrupt events typically include instruction based exception events, hardware based exception events, software interrupts, hardware interrupts, and various other events that alter the sequential execution of instructions.

For example, one particular type of exception event is a software interrupt that alters the program counter and causes the processing of instructions to jump to a different location. Another example is a hardware interrupt, such as one received by a peripheral device, that causes execution to alter and transfer processing to an interrupt routine. These types of exception and interrupt events are important in that they may disrupt the otherwise orderly operation of the integrated circuit design and cause errors to occur. Thus, the interruption of instruction execution within the hardware implementation must also be investigated to verify that the hardware implementation continues to properly execute once the exception has been satisfied.

Finally, from step 106, the method proceeds to step 108 of processing the plurality of templates, the plurality of register models, and the plurality of exception events to produce the instruction/data stream. The instruction/data stream include a plurality of events that when executed by the hardware implementation verifies the operation of the hardware implementation. Thus, step 108 includes generating a number of instructions that will preferably first initialize the hardware implementations, next cause the hardware implementation to execute specific instructions, then to partially validate the intermediate state (or signature) of the hardware implementation with respect to expected results when required, and finally to continue with testing of further instructions and events based within the hardware implementation. Finally, when execution of the instruction/data stream is nearly complete, the final state of the hardware implementation is completely validated with an expected state. The instruction/data stream further includes instructions that terminate execution of the instruction/data stream when the hardware implementation fails to function properly. Such termination instructions apprise a user of the method 100 of the point in the instruction/data stream at which execution failed.

Thus, the method 100 of FIG. 1 provides a full verification of a hardware implementation with respect to a higher level integrated circuit design. As compared to the prior methods, which merely tested a portion of a hardware design, the present invention tests specific operational points within a hardware implementation expected to be problematic. The exceptions, interrupts, and boundary conditions chosen for testing within the hardware implementation are based upon the limitations of the hardware implementation itself and therefore provide significantly more thorough testing than did the prior techniques. Thus, the method or method of the present invention provides superior results as compared to the prior methods.

The generation of expected results by the method 100 of the present invention includes using design equations for system registers, general registers, and instructions (contained in the templates). Thus, specific expected results are generated based upon the actual design of the integrated circuit unlike the prior art techniques that used a general, non-specific model to generate expected results.

The method 100 of the present invention preferably also include the step of receiving system element behavior and processing the system element behavior to generate additional test cases. The system element behavior describes the operation of system elements within the integrated circuit design. The system elements may comprise memory management units, load/store units, cache memory units, receiver units, transmitter units, receiver/transmitter units, integer units, floating point units, co-processors, arithmetic logic units, input-output controllers, memory units, and various other functional components that may be present within a modern integrated circuit. These system elements interact with the pipeline or execution unit that executes the instructions. Further, they often issue interrupts that affect the execution of instructions. Thus, by incorporating the system element behavior, the method 100 of the present invention may also verify the operation of the system elements in conjunction with the execution or pipeline unit which execute the particular instructions previously described. By performing such a verification, the complete integrated circuit design may be tested fully for the particular hardware implementation that has been created. Thus, the method 100 including the additional system element behavior steps performs verification not previously accomplished by the prior devices.

Figure 2:
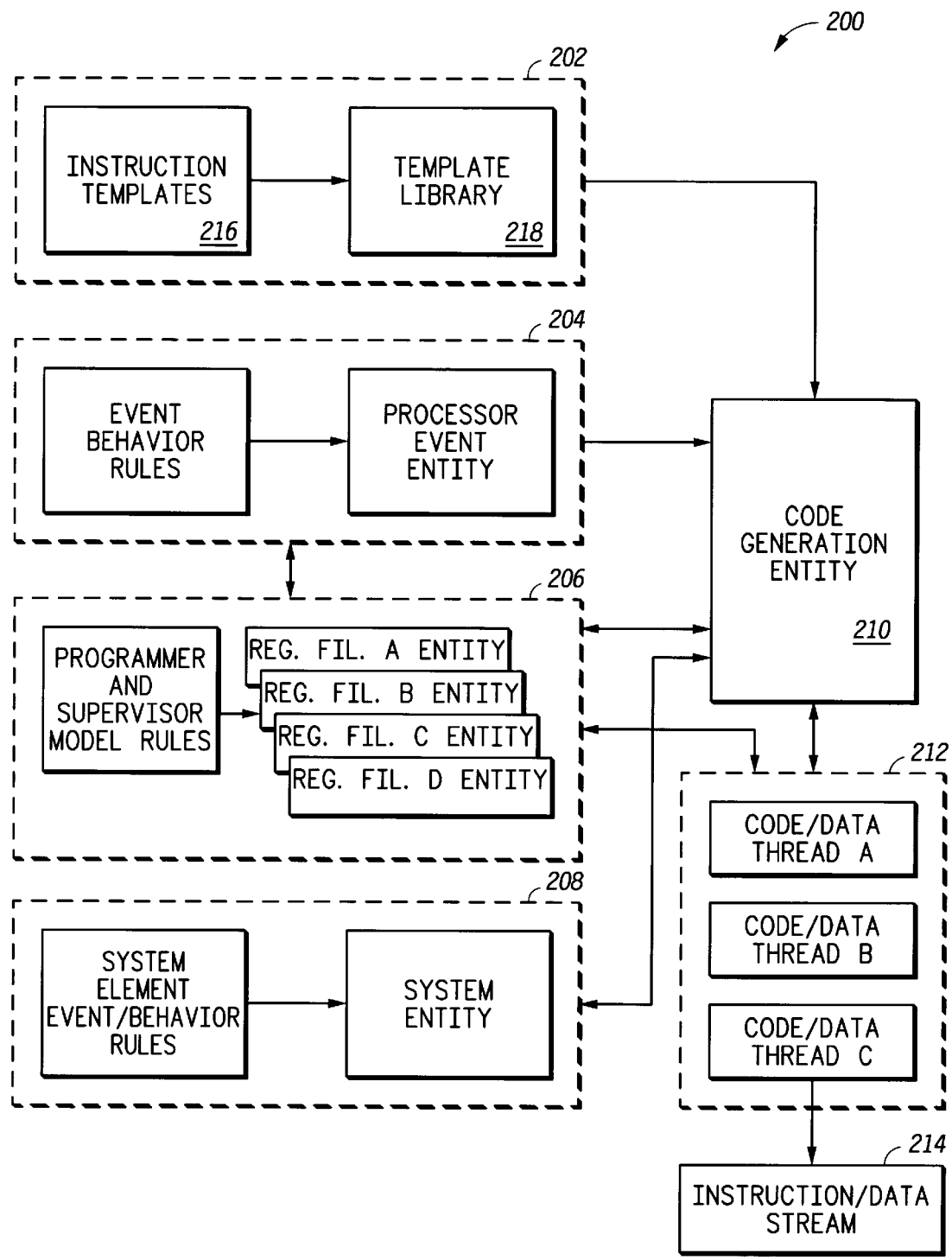
FIG. 2 is a block diagram illustrating the functional components of an apparatus and method of the present invention.

FIG. 2 is a block diagram that illustrates the functional components 200 employed in conjunction with the method 100 of the present invention. Functional block 202 relates to the plurality of templates, functional block 204 relates to user defined rules, functional block 206 describes register models, functional block 208 describes system element behavior, and functional block 210 describes represents the code entity generation block of the present invention. Functional block 212 represents a plurality of code/data threads that are combined to create the instruction/data stream 214 that is used to verify the operation of the hardware implementation.

Functional block 202 receives the plurality of instruction templates 216 which are combined to create a template library 218. The template library 218 provides an operational description of the integrated circuit design. However, the template library 218 need not include all available templates for the particular integrated circuit design. Further, not all of the templates in the template library 218 need to be used as a basis for testing in one contiguous test case. Example 1 below illustrates a typical template.

EXAMPLE 1

Template for ADDC Instruction

```
ADDC RS1,RS2 [RS1 + RS2 + CARRY_BIT] INTEGER
CPU
2 RS1 RS2 NONE NONE
0x00000000   0x00000001   0x80000000   0x80000001   0xFFFFFFFF   0x7FFFFFFF   0x80000000   0xFFFFFFFF   0xa5a5a5a5
0xFFFFFFFF   0xFFFFFFFF   0xFFFFFFFF   0xFFFFFFFF   0xFFFFFFFF   0xFFFFFFFF   0xFFFFFFFF   0xFFFFFFFF
0xFFFFFFFF   0xFFFFFFFF   0xFFFFFFFF   0xFFFFFFFF   0xFFFFFFFF   0xFFFFFFFF   0xFFFFFFFF   0xFFFFFFFF
0xFFFFFFFF   0xFFFFFFFF   0xFFFFFFFF   0xFFFFFFFF   0xFFFFFFFF   0xFFFFFFFF   0xFFFFFFFF   0xFFFFFFFF
0xFFFFFFFF   0xFFFFFFFF   0xFFFFFFFF   0xFFFFFFFF   0xFFFFFFFF   0xFFFFFFFF   0xFFFFFFFF   0xFFFFFFFF
0x00000001   0x00000002   0x00000004   0x00000008   0x00000010   0x00000020   0x00000040   0x00000080
0x00000100   0x00000200   0x00000400   0x00000800   0x00001000   0x00002000   0x00004000   0x00008000
0x00010000   0x00020000   0x00040000   0x00080000   0x00100000   0x00200000   0x00400000   0x00800000
0x01000000   0x02000000   0x04000000   0x08000000   0x10000000   0x20000000   0x40000000   0x80000000
0x00000000   0x00000000   0x80000000   0x80000001   0xFFFFFFFF   0x7FFFFFFF   0xFFFFFFFF   0x00000001   0x5a5a5a5a
0x00000001   0x00000002   0x00000004   0x00000008   0x00000010   0x00000020   0x00000040   0x00000080
0x00000100   0x00000200   0x00000400   0x00000800   0x00001000   0x00002000   0x00004000   0x00008000
0x00010000   0x00020000   0x00040000   0x00080000   0x00100000   0x00200000   0x00400000   0x00800000
0x01000000   0x02000000   0x04000000   0x08000000   0x10000000   0x20000000   0x40000000   0x80000000
0xFFFFFFFF   0xFFFFFFFF   0xFFFFFFFF   0xFFFFFFFF   0xFFFFFFFF   0xFFFFFFFF   0xFFFFFFFF   0xFFFFFFFF
0xFFFFFFFF   0xFFFFFFFF   0xFFFFFFFF   0xFFFFFFFF   0xFFFFFFFF   0xFFFFFFFF   0xFFFFFFFF   0xFFFFFFFF
0xFFFFFFFF   0xFFFFFFFF   0xFFFFFFFF   0xFFFFFFFF   0xFFFFFFFF   0xFFFFFFFF   0xFFFFFFFF   0xFFFFFFFF
0xFFFFFFFF   0xFFFFFFFF   0xFFFFFFFF   0xFFFFFFFF   0xFFFFFFFF   0xFFFFFFFF   0xFFFFFFFF   0xFFFFFFFF
1 RS1
PIPESLOTS 2
SLOT 1
Instruction 1    Instruction 2    Instruction 3
Instruction 4    Instruction 5    Instruction 6
Instruction 7    Instruction 9    Instruction 10
SLOT 2
Instruction 1    Instruction 2    Instruction 3
Instruction 14   Instruction 15   Instruction 16
Instruction 17   Instruction 18   Instruction 19
ENDSLOTS
AFFECTED [((0x80000000 & RS1) & (0x80000000 & RS2))//most significant bit overflow
 | (((0x7FFFFFFF & RS1) + (0x7FFFFFFF & RS2) + CARRY_BIT) & (0x80000000 & RS1))//carry out of bit 30 with bit 31 already set
 | (((0x7FFFFFFF & RS1) + (0x7FFFFFFF & RS2) + CARRY_BIT) & (0x80000000 & RS2))//carry out of bit 30 with bit 31 already set
    ]
PC_EQUATION [PC + 0x4]
```

The first line in the file, "ADDC RS1,RS2 [RS1+RS2+ CARRY_BIT] INTEGER", includes an instruction mnemonic (ADDC) for a respective that is executable by the execution or pipeline unit, in this case the instruction. Also included in the first line is an operand format (RS1, RS2), an equation for the instruction ([RS1+RS2+CARRY_BIT]) and an instruction class (INTEGER). The second line relates the functional unit affected by the instruction (CPU) which operates as the execution unit in the hardware implementation. The third line represents the number of source operands (2), the operands (RS1 and RS2), and the limits placed on the selection of operands/register resources (NONE).

The next 18 lines represent testable boundary conditions for the instruction associated with the template. The first 9 lines correspond to the first operand of the instruction and the second 9 lines correspond to the second operand of the instruction. In Example 1, 73 different boundary conditions for the instruction are to be investigated. The boundary conditions are derived from designer's knowledge of the hardware implementation. These boundary conditions are determined to test particular boundary conditions for the instruction that may cause operational difficulties in the hardware implementation. Thus, these particular boundary conditions are specific to the hardware implementation and necessarily specifically test the actual limitations of the hardware implementation, unlike the prior methods.

The following line, "1 RS1" indicates both the number of destination registers (1) and identifies the destination register template (RS1). The next line "PIPESLOTS 2" indicates the depth of variations significant to the pipeline of the hardware to be tested with the respective instruction (ADDC) of the template. In this case, pipeline variation depth of two is significant and will be investigated for the particular instruction of the template. The eight lines that follow define the set of instructions which can be selected from to form the pipeline sequences to be investigated and are followed by a line (ENDSLOTS) which indicates that the pipe-slot options have been stated. The set of instructions may involve reuse of instructions from different slots as well as the ADDC instruction itself.

The next six lines in the Example indicate a bit that is affected by the particular instruction. However, multiple bits may be modeled using this approach and investigated as well. The particular example indicates particular arguments and occurrences that cause carry out of bits to a carry bit which may be located in but not limited to a system register. The final line in Example 1 describes the effect of executing the instruction on the program counter or "PC" register. With the ADDC instruction, its execution causes the PC to increment by four.

Thus, Example 1 provides an example of a typical template employed in accordance with the present invention. Functional block 202 reads in all instruction templates 216 to be employed in the method 100 of the present invention and assembles the templates 216 into a library. If the boundary conditions or pipeline sequences of the templates are to be investigated, the boundary condition values are used by the code/data generation entity 210 to generate the instruction/data stream 214. However, if the boundary conditions and pipeline sequences are not to be executed, the templates are still preferably used by the code/data generation entity 210 to predict the state of the hardware implementation and to be used in the generation of instructions to be written in the instruction/data stream 214. The method 100 of the present invention does not require that a template be generated for each executable instruction type. It merely requires those templates employed to verify the particular operation of the hardware implementation under test.

Functional block 204 represents particular rules provided by a user for the test case in question. These rules, for example, may determine that particular types of instructions represented by the templates are tested fully in a particular case. Alternatively, the rules input by the user may cause a particular system element and its associated operation with the instruction unit within the hardware implementation to be tested. Based upon the particular rules provided by the user, an instruction/data stream 214 is generated that it is tailored to particular requirements of the test case.

Functional block 204 receives event behavior rules from a user of the method 100 and compiles the event behavior rules into a processor event entity that compiles the rules into a format that may be used to generate specific instruction to investigate the events. Example 2 illustrates a typical set of rules corresponding to the behavior of an integrated circuit design during a particular type of event. The particular type of event illustrated in Example 2 is that of an instruction class 1 exception table which could occur upon execution of the instruction within the class. Example 2 provides event behavior rules which define specific sequences of events that could occur in such an operation.

EXAMPLE 2

Functional Class 1 Event Behavior Rules

```
100 // max number of events allowed in table
// event_mnemonic Data_side_event Event_swept_on_each_date_transaction PC_saved_to_register_mnemonic
Target_PC_address Next_PC_value PSR_mask additional_value_added_to_next_PC_for_end_of_dataside_transaction
Is_a_branch_destination;
// exception_recognition_location = instruction under test + an offset (Next_PC_value)
Significant event 1 (will contain an entry for each argument)
Significant event 2 (will contain an entry for each argument)
Significant event 3 (will contain an entry for each argument)
Significant event 4 (will contain an entry for each argument)
Significant event 5 (will contain an entry for each argument)
Significant event 6 (will contain an entry for each argument)
Significant event 1 (will contain an entry for each argument)
Significant event 7 (will contain an entry for each argument)
Significant event 8 (will contain an entry for each argument)
Significant event 9 (will contain an entry for each argument)
Significant event 10 (will contain an entry for each argument)
```

Example 2 illustrates a table outlining exceptions to be investigated that correspond to the instructions in class 1. The first line of the Example defines the maximum number of events (100) that are allowed in the particular table. The next three comment lines list the significance of the arguments provided in each particular exception event to be executed for the the class 1 instruction condition. The two comment lines that follow indicate how recognition of a class 1 instruction exception affects the program counter. Each of the seventeen lines that follow in Example 2 represent a particular combination and sequence to be investigated for the particular hardware design within a particular instruction class. For each particular interrupt or exception condition under test, an entry is input as an event behavior rule so that code may be generated within the code stream to verify the operation of the hardware implementation for the condition. The present invention supports the use of different instruction classes as is required for modern designs.

Functional block 206 represents the plurality of register models and subsequent representations of the registers and their contents during the instruction/data stream 214 construction process. These characterizations are referred to generally as programmer and supervisor model rules for the registers. Each of the registers within the integrated circuit design has certain behavioral characteristics that may be described logically in an equation format. Further, each of the plurality of register models has certain overflow and under flow behavior that may be represented in an equation or otherwise descriptive manner. In creating the plurality of events in the instruction/data stream 214, the various registers within the integrated circuit design must be manipulated to cause specific events to occur and to allow particular instructions, boundary conditions, and exceptions to occur. Thus, included in functional block 206 for each of the registers, are status characteristics respective to the registers. In this fashion, the registers may be employed by the method of the present invention to create an instruction/data stream 214 that systematically tests and verifies the operation of the hardware implementation.

Example 3 provides descriptions of particular registers preferably used in accordance with the method 100 of the present invention. These descriptions are used to compile register file entities that are used to track contents of registers to generate verification checks.

EXAMPLE 3
Register Definitions

```
14
REG0 CR0 BITWISE 32 0xBF7FF7D3 DEFINED
31  Implemented bit RESET 0
30  Undefined RESET 0
29  Implemented bit RESET 0
28  Implemented bit RESET 0
27  Implemented bit RESET 0
26  Implemented bit RESET 0
25  Unused bit RESET 0
24  Undefined bit RESET 0
23  Implemented bit RESET 0
22  Implemented bit RESET 0
21  Implemented bit RESET 0
20  Implemented bit RESET 0
19  Implemented bit RESET 0
18  Implemented bit RESET 0
17  Implemented bit RESET 0
16  Implemented bit RESET 0
15  Undefined bit RESET 0
14  Undefined bit RESET 0
13  Unused bit RESET 0
12  Unused bit RESET 0
11  Implemented bit RESET a
10  Implemented bit RESET 0
 9  Implemented bit RESET 0
 8  Implemented bit RESET 0
 7  Implemented bit RESET 0
 6  Undefined bit RESET 0
 5  Undefined bit RESET 0
```

-continued

```
 4  Unused bit RESET 0
 3  Unused bit RESET 0
 2  Undefined bit RESET 0
 1  Undefined bit RESET 0
 0  Implemented bit RESET 0
REG1   CR1   GENERAL 32 0xFFFFFFFF RESET 0
REG2   CR2   GENERAL 32 0xFFFFFFFF RESET 0
REG3   CR3   GENERAL 32 0xFFFFFFFF RESET 0
REG4   CR4   GENERAL 32 0xFFFFFFFF RESET 0
REG5   CR5   GENERAL 32 0xFFFFFFFF RESET 0
REG6   CR6   GENERAL 32 0xFFFFFFFF RESET 0
REG7   CR7   GENERAL 32 0xFFFFFFFF RESET 0
REG8   CR8   GENERAL 32 0xFFFFFFFF RESET 0
REG9   CR9   GENERAL 32 0xFFFFFFFF RESET 0
REG10        CR10  GENERAL 32 0xFFFFFC00 RESET 0
REG11        CR11  GENERAL 32 0xFFFFFFFF RESET 0
REG12        CR12  GENERAL 32 0xFFFFFFFF RESET 0
PC PC GENERAL 32 0xFFFFFFFE RESET 0
```

Example 3 illustrates definitions for fourteen registers provided in a particular implementation of the method 100 of the present invention. The first line in the example (14) defines the number of registers to be allocated. The next line defines register REG0, otherwise known as CR0, which is a BITWISE register having a width of 32 bits an and-mask of OxBP7FF7D3 hex, and a defined reset value for each bit. The next 32 lines of the Example define each of the bits of the REG0 register. While the register has both the REG0 name and the CR0 name, the names are interchangeable and the register may be referred to by either label. Following the REG0 definitions are additional definitions for register REG1 through PC. Each of the definitions provides the same information for the respective register as did the line for the REG0 register. Thus, Example 3 defines fourteen (14) registers, one bitwise register and thirteen general registers.

For each of the registers defined in Example 3, functional block 206 creates a register file entity. Each register file entity tracks the behavior of the register during creation of the stream of instructions. For each point in the instruction/data stream 214 during creation, the contents of the registers are defined in the register files. The contents of the register files define the "state" or "signature" of the integrated circuit design for respective points in execution of the instruction/data stream 214. Thus, for verification of a hardware implementation of the integrated circuit, the instruction/data stream 214 compares expected values as obtained from the register files against respective states of the hardware implementation Functional block 208 includes system entities that test the operation of the system elements in conjunction with other components of the integrated circuit design. System elements include behavioral models that describe the operation of the system elements. System element behavior includes manner in which the system elements interact with the instruction or pipeline unit of the integrated circuit design so as to enable the method of the present invention to investigate interactions between the execution or pipeline unit and the system elements.

The system element behavioral models also include related interrupt conditions that may be generated by the system element that could affect the operation of the execution unit, the mechanisms in place for controlling system elements, as well as the internal operations of the system elements. Functional block 208 therefore provides a mechanism for generating an instruction/data stream 214, based on event behavior rules, which validates a hardware implementation including system elements under operation.

Functional block 210 represents the code/data generation entity 210 which acts as an engine in creating the instruction/ data stream 214. The code/data generation entity 210 receives input from functional blocks 202, 204, 206, and 208, interacts with functional blocks 206 and 208 to track states of registers and system elements, and writes code/data threads that eventually become the instruction/data stream 214. The code/data generation entity 210 is directed primarily by the user input provided in blocks 202, 204, and 208 that defines the extend of verification performed by the instruction/data stream 214.

Based upon the user input of block 204, the code/data generation entity 210 selectively verifies the operation of identified templates, identified interrupt and exception events, and identified system element events for the hardware implementation of the integrated circuit design. The templates of interest establish boundary and pipeline conditions, the event behavior rules select various conditions to be tested and provide interrupts and exceptions of interest, and the system event entities provide the system element behavior to be investigated. The code/data generation entity 210 receives all of the input, selectively writes instructions to test boundary, interrupt, and exception conditions, interacts with functional blocks 206 and 208 to generate expected results, and writes instructions to the instruction/data stream 214 that will verify that the hardware implementation has correctly operated upon execution of the instructions. Thus, the code/data generation entity 210 receives the wealth of information and operates to create the instruction/data stream 214 that is used to perform the verification.

Block 212 of FIG.2 illustrates that the code/data generation entity 210 preferably generates a code/data thread for each boundary condition, for each exception, for each interrupt, for each system element, and for each combination of the four under test. The code/data threads assembled in succession become the instruction/data stream 214 that fully tests the operation of the hardware implementation of the integrated circuit as directed by the user.

Unlike the prior devices, the code/data threads may be run in succession without wholesale re-initializing the hardware implementation. Such as the case because of unique feature included in the method of the present invention. The method 100 of the present invention tracks the contents of the registers contained within the hardware during generation of code/data threads. For each instruction provided in a thread, the values of the registers are maintained in the file entities. The value stored are used to verify the state of the hardware implementation. Not only are these files fully accurate with respect to the integrated circuit design, but they are accessible so that intermediate verification of the hardware implementation may be performed.

Upon the completion of one thread, the code/data generation entity 210 determines which registers will be destroyed via instructions which will not use the current register values as a basis for the next register values, i.e. loads from memory or other registers in a subsequent code/data thread generated. If the contents of one of the registers will be destroyed during execution of a subsequent code/data thread, the code/data generation entity 210 generates code that performs a partial intermediate verification of the contents of the register whose contents will be destroyed. Typically, to verify the contents of a particular register, the register whose contents will be destroyed and the contents of a second register, not of intermediate interest, are manipulated via simple instructions, such as adds and rotates, until the contents of the two registers (as contained in the file entities) are equal. Then a compare instruction between the two registers is written. During execution of this thread of code, if the contents of the registers are not equal an error routine will be called that halts the execution of the instruction/data stream 214 and reports to the user that the test has failed and identifies the failure point. The user may then determine, based upon this report, the point at which the instruction/data stream 214 began to fail. However, if the contents of registers under comparison are equal during execution of the instruction/data stream 214, the hardware implementation will continue to execute code written by the code/data generation entity 210. Unlike the prior art methods which reinitialized the state of the hardware implementation after each code segment execution, the method 100 of the present invention only requires an intermediate verification.

Figure 3B:
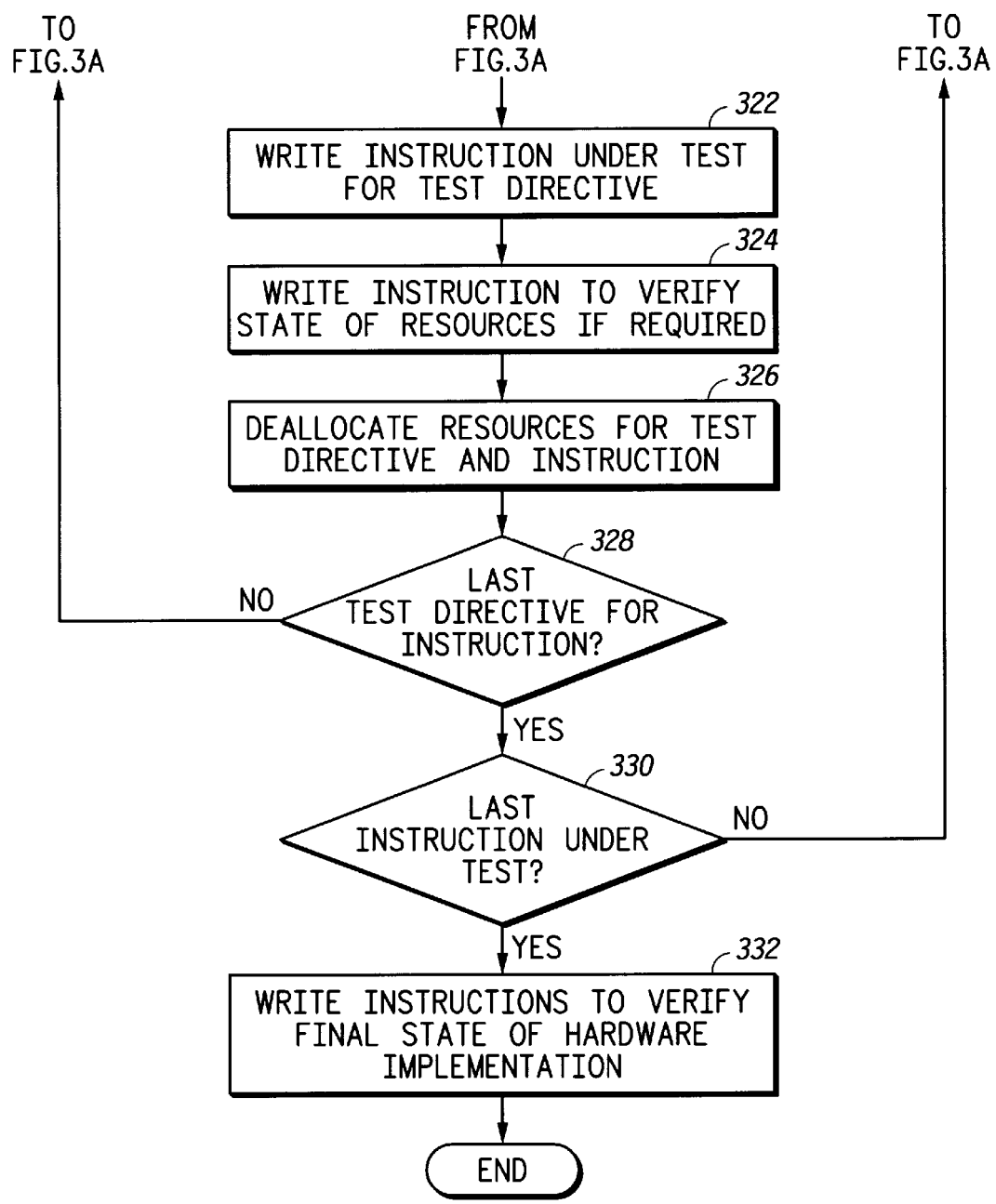
FIG. 3b is a logic diagram illustrating a second portion of the method of FIG. 3a for generating instructions used to verify a hardware implementation of an integrated circuit design in accordance with the present invention.

FIG. 3 illustrates a more detailed implementation 300 of the method of the present invention. The method commences at step 302 wherein the code/data generation entity 210 reads in the plurality of templates. As previously described, each of the plurality of templates corresponds to an instruction executable by the integrated circuit design. Preferably, a template library is constructed in step 302 that will be later employed. From step 302 the method proceeds to step 304 wherein register models are read. Based upon the templates read in step 302, register models are input that allow for the tracking of the state of the integrated circuit design during generation of the instruction/data stream 214.

From step 304 the method proceeds to step 306 of reading in templates for the system elements. As previously described, the method of the present invention preferably considers system element behavior wherein the system element behavior describes the operation of systems elements within the integrated circuit design. Templates corresponding to the system elements are read in step 306 so that the behavior of the system elements may be tested and monitored in the generation of the instruction/data stream 214.

Next, at step 308, test directives are input for the particular testing being executed by the instruction/data stream 214. As previously discussed, the instruction/data stream 214 may be tailored to test as large or as small a portion of the integrated circuit design as is required. Thus, at step 308, the boundaries of the particular testing to be performed in a respective instruction/data stream 214 are set.

Next, at step 310, instructions are written to initialize the hardware implementation to a known, initial state immediately after reset at time 0. Such instructions will typically include resetting the registers to known states, initializing memory, and setting the program counter (PC register) to a predetermined entry point into further instructions. With the method 300 of the present invention, the hardware implementation is initialized fully only a single time, unlike prior art methods that fully reinitialized the state of the implementation under test after each code segment execution. Further, at step 310, the contents of the register file entities are updated so that they correspond to the values to which the registers are initialized. The register file entities are initialized through the selective execution of code/data threads written by the code/data generation entity 210.

Next, at step 312, a next instruction under test is read from the test directives and the template (model) is retrieved from the template library constructed in step 302.corresponding to the instruction. Then, at step 314, a next test directive for the instruction under test is read from the test directives. The test directive could correspond to a request that all boundary conditions be tested for each system event, for each associated interrupt or exception, or simply by themselves without additional variations. As previously described, the instruction/data stream 214 generated by the method of the present invention need not include all possible boundary conditions, exceptions, interrupts, and system events that may be executed by the integrated circuit design.

From step 314 the method 300 proceeds to step 316 wherein resources are allocated for the instruction under test for the particular test directive. Various resources are required to test each template and directive. Thus, step 316 determines which resources are required and allocates the resources by having the instruction under test contact and request the necessary resources.

Next, at step 318 the code/data generation entity 210 determines which resources will be destroyed by the instruction generated for the particular template and drives the values of the resources to verifiable states if required. For example, a load immediate instruction will destroy the contacts of a respective target register. In this situation, in order to determine that the hardware implementation running the previous instruction/data stream 214 has been functioning properly, the partial state or signature of the hardware implementation that will be destroyed must be verified. Thus, at step 318, the code/data generation entity 210 first determines whether values stored in the registers will be destroyed.

If register contents will be destroyed by subsequent instructions, at step 318, the code/data generation entity 210 writes instructions that drive the values of the respective registers to verifiable values. Then, at step 320, the code/data generation entity 210 writes instructions to verify the contents of the registers whose contents will be destroyed. For example, if a subsequent instruction is "LDI A C", load immediately into register A the contents of register C, the contents of register A will be destroyed. Thus, at steps 318 and 320, code must be written that, when executed, verifies that the contents of register A are correct. Step 318 generates code that drives the contents of register A to a verifiable value and step 320 generates code that verifies the contents of register A.

A preferred methodology employed in step 318 is to drive the value of the contents of register A toward the value of the contents of another register (register D) having a contents near in value to the contents of register A and also to drive the contents of register D toward the value of register A. For example, if the contents of register A are 1000 hex and the contents of register D are 1080 hex, these registers would have values near one another. In this situation, the code/data generation entity 210 first writes instructions, such as adds, rotates, and other simple instructions that drives the contents of the registers to be equal (based upon the expected values of the registers). Then, the code/data generation entity 210 writes a compare instruction to compare the contents of the registers A and D. Upon execution of the instruction/data stream 214, the hardware implementation of the integrated circuit design executes the instructions to first alter the contents of registers A and D and then compares their contents. If no errors have occurred upon prior executions of code, the contents of the registers are driven to the same value and compared to perform a partial verification of the state of the hardware implementation. If the comparison shows that the contents are equal, execution continues. However, if the comparison shows that the contents of the registers are not equal, execution branches to an error routine that signals the user. Thus, the code/data generation entity 210 provides a mechanism for partially and immediately verifying the state of the hardware implementation against reference values kept in the register file entities without a wholesale initialization of the hardware implementation.

Next, at step 322, the code generation 210 replicates the instruction under consideration respective to the template. Next, at step 324, the code/data generation entity 210 writes instructions for verifying the state of resources as required. Typically, after each execution of an instruction under test, some partial results relating to the instruction under test are verified. Instructions to verify those results are written at step 324. Typically, the results are verified by comparing the full or partial state of the hardware implementation with reference values generated in functional block 206 and 208. Next at step 326, the code/data generation entity 210 deallocates resources that were allocated in step 316.

From step 326 the method 300 proceeds to step 328 where it determines whether all test directives have been satisfied for the particular template. If at step 328, it is determined that not all test directives have been satisfied for the particular template, execution returns to step 314. However, if at step 328, it is determined that all test directives have been satisfied, the method proceeds to step 330.

At step 330 it is determined whether the instruction corresponding to the template was the last instruction (or template) under test. If it was not, the method returns to step 312 wherein another template is selected. However, if it is determined that the current instruction is the last instruction under test, the method proceeds to step 332 wherein instructions are written to perform a final verification of the state of the hardware implementation. From step 332 the method 300 ends.

When the method 300 is complete, the code/data generation entity 210 has written a complete instruction/data stream 214 that may be used to verify a hardware implementation of the integrated circuit design. The code stream include opcodes and arguments that will test particular instructions, boundary conditions for the instructions, system events, and exceptions and interrupts for the particular instructions that designers believe may be problematic for the particular hardware implementation and integrated circuit design. As opposed to the prior art methods, the method 300 of FIG. 3 does not require a complete re-initialization after the testing of each particular instruction. The method 300 provides for intermediate verification of register or storage values when those values will be destroyed during execution of the instruction/data stream 214. In this fashion, the state of the machine is guaranteed to be kept track of during the operation of the hardware implementation without jeopardizing the validity of the testing.

Figure 4:
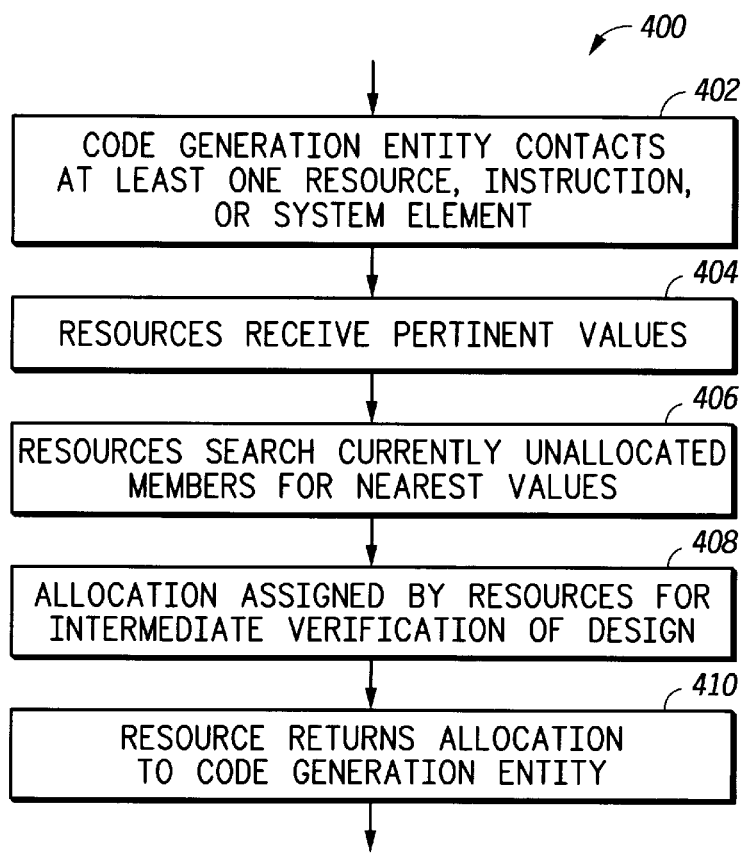
FIG. 4 is a logic diagram illustrating specific sub-steps used to allocate resources within the method of the present invention.

FIG. 4 illustrates particular sub-steps 400 associated with resource allocation within step 316 of method 300 of FIG. 3. Such sub-steps show a particular implementation of how resources are allocated to verify any portion of the state of the hardware implementation. Beginning at sub-step 402, the code/data generation entity 210 contacts (makes a request to) a resource such as a system register, general register, instruction template 216, or system entity. Each resource responds indicating whether it is currently allocated or unallocated and has a valid value or is unallocated and does not have a valid value. If the resource does not have a valid value, it can be overwritten without destroying a partial state of the integrated circuit design.

From sub-step 402 the method proceeds to sub-step 404 wherein the code/data generation entity 210 provides values that are needed for the particular instruction that is to be executed. For example, if a required value is 0080 hex, the value 0080 hex will be transferred to all resources (registers) that been identified as available. Next at sub-step 406, the resources (registers) search all unallocated members of the group of resources for nearest values. At sub-step 408, the resource (register) having contents nearest to the value 0080 hex is assigned and at sub-step 410 the resource returns its allocation to the code/data generation entity 210 for use in the generation of code to perform an intermediate verification of hardware implementation state. Thus, FIG. 4 illustrates sub-steps to most efficiently allocate resources for intermediate verification of machine state, such sub-steps and techniques unknown in the prior methods.

Figure 5:
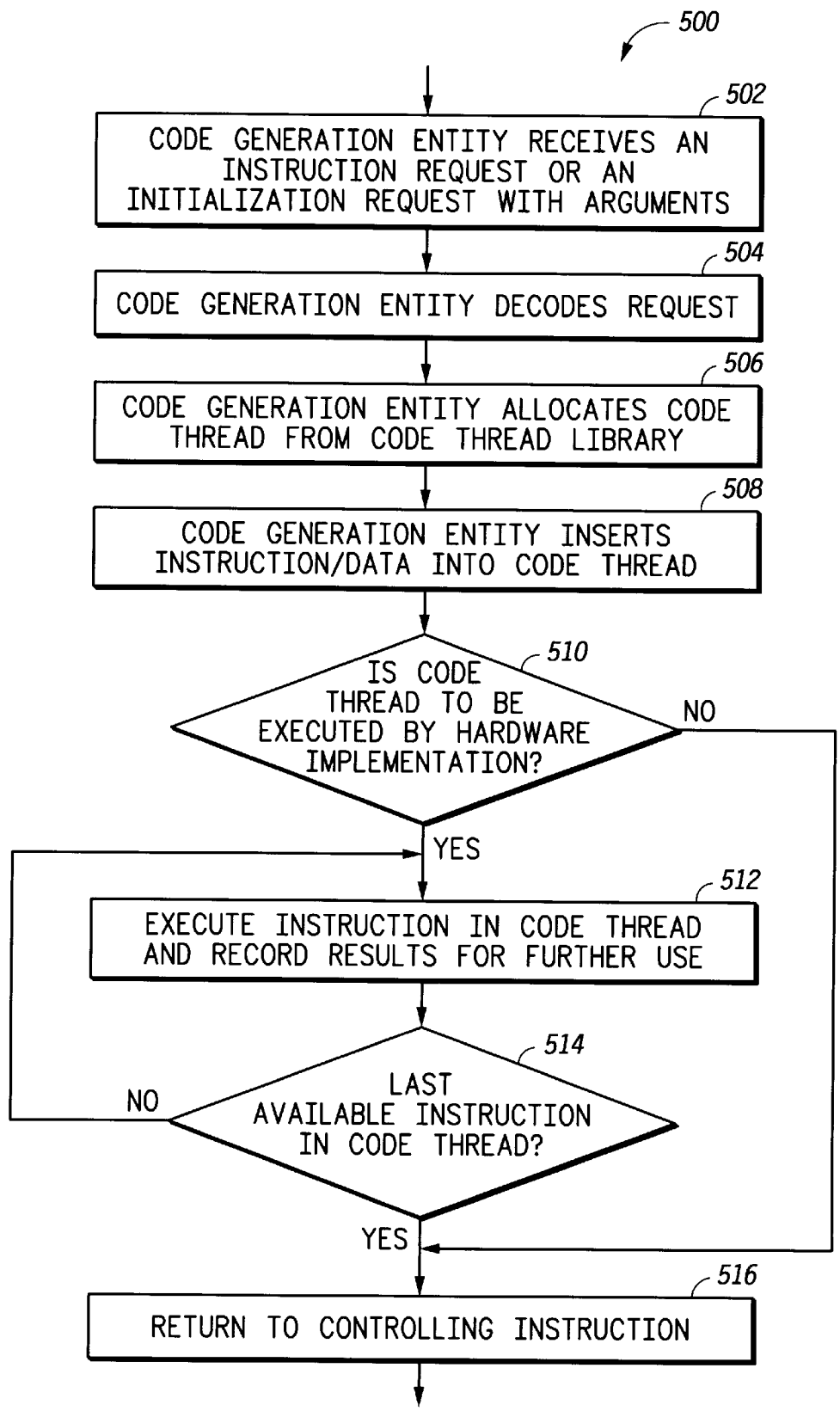
FIG. 5 is a logic diagram illustrating specific sub-steps for generating instruction threads and expected results in accordance of the present invention.

FIG. 5. illustrates sub-steps 500 related to the execution of step 310, step 318, step 320, step 322, step 324, and step 332 in the method of 300 of FIG. 3. The sub-steps 500 illustrated in FIG. 5 are executed any time instructions or data are written by the code/data generation entity 210. Instructions and data are written for example in step 310 when the code/data generation entity 210 writes code threads that will initialize the hardware implementation to a known state. Instructions and data are also written, for example, at step 320, when resources are initialized for intermediate partial state verification checks. The sub-steps relating to portion 500 of the method of the present invention are executed by a portion of the code/data generation entity 210 that is accessed whenever instructions are written to the instruction/data stream 214.

The instruction begin at sub-step 502 where the code generation accepts an instruction request, an initialization request, or a compare request. For example, at step 310 of FIG. 3, code/data generation entity 210 receives requests to write instructions to initialize the hardware information to a known state. Such instructions are received at sub-step 502 of FIG. 5. Next, at sub-step 504, the code generator 504 decodes the request for further processing. Then, at sub-step 506, the code/data generation entity 210 retrieves a code/data thread from a code/data thread library corresponding to the request. Next, at sub-step 508, arguments are inserted into the code/data thread, the code/data thread becoming part of the instruction/data stream 214. Each of these code/data threads responds to a particular requested instruction or sequence of instructions.

From sub-step 508 the method proceeds to sub-step 510 wherein it is determined whether the code/data thread is to be executed. If the code/data thread alters the state of the integrated circuit design, it is to be executed. However, in some cases, such as those instructions that affect only the operation of other system elements, code/data threads are written that are not executed by the hardware implementation such that they alter the machine state. If, at sub-step 510, it is determined that the code/data thread is not to be executed, the method proceeds to sub-step 516 wherein control is returned to the controlling instruction. However, if the code/data thread is to be executed by the hardware implementation, the method proceeds to sub-step 512 wherein a next instruction in the code/data thread is executed. From sub-step 512, the method proceeds to sub-step 514 wherein it is determined whether the instruction previously executed was the last instruction in the code/data thread. If it was, the method proceeds to sub-step 516. However, if it was not, the method proceeds to sub-step 512 wherein a subsequent instruction is executed.

Thus, the sub-steps 500 of FIG. 5 illustrate a preferred manner in which the present invention writes instructions and tracks an expected state of the integrated circuit design. In this fashion, the expected state may be used to verify an actual execution of the instructions in the instruction/data stream 214 by the hardware implementation.

Figure 6:
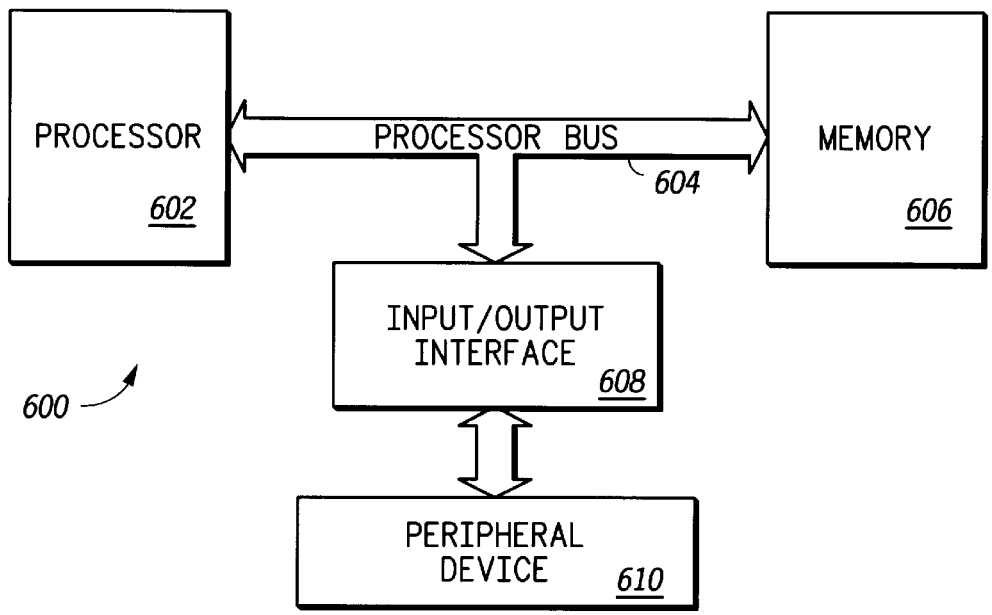
FIG. 6 is a block diagram illustrating a data processing system in accordance with the present invention.

FIG. 6 illustrates an apparatus 600 for generating an instruction/data stream 214 that may be used to verify a hardware implementation of an integrated circuit design.

The apparatus comprises a processor 602, memory 606, processor bus 604, input/output interface 608, and a peripheral device 610. The components of the apparatus 600 work in concert to facilitate the generation of the instruction/data stream 214 and further may incorporate the hardware implementation for further testing.

The processor 602 is preferably of a type known in the art capable of processing instructions and data to accomplish goals. The processor 602 operably couples to the memory 604 and the input/output interface via the processor bus 604. The processor bus 604 has sufficient capability to transfer data, instructions, addresses, and control signals to facilitate the cooperative operation of the components of the present invention. The input/output interface 608 operably couples to the processor 602 through the processor bus 604 and operably couples to the peripheral device 601 via another interface. Through the input/output interface 608, the processor 602 may control the operation of the peripheral device 610, for example if the peripheral device is an interface to an actual hard-wired hardware implementation of the integrated circuit design. In such a situation, the peripheral device 610 could be a plug-in device used to the operation of a computer chip.

The memory 606 operably couples to the processor bus 604 and serves to store data and instructions. The processor 602 accesses data and instructions stored in the memory 606 across the processor bus 604. The memory 606 stores instructions for receiving a plurality of templates, wherein each of the plurality of templates describes at least a partial behavior of the integrated circuit design for a respective instruction. The memory 606 also stores instructions for receiving a plurality of register models, wherein the plurality of register models describe the operation of a plurality of registers within the integrated circuit design. The memory 606 further stores instructions for receiving a plurality of exception events, wherein each of the plurality of exception events corresponds to a potentially problematic operation of the hardware implementation of the integrated circuit design. Finally, the memory 606 stores instructions for processing the plurality of templates, the plurality of register models, and the plurality of exception events to produce the instruction/data stream 214, wherein the instruction/data stream 214 includes a plurality of events, and wherein an execution of the instruction/data stream 214 by the hardware implementation verifies the operation of the hardware implementation.

Further, the memory 606 preferably also stores instructions for receiving system element behavior, wherein system element behavior describes operation of system elements within the integrated circuit design. The memory could comprise random access memory or other such memory, such as magnetic media, that enables the storage of the information as required. The memory 606 may also store instructions consistent with those described in FIGS. 2 through 5. Thus, the data processing system 600 facilitates the execution of the present invention.

The present invention also includes computer readable storage devices adapted for use with a digital computer such that the digital computer may read the computer readable storage device. The computer readable storage devices may include floppy discs, hard discs, CD ROMs, core memories, dynamic memories, static memories, optical memory devices, or any other types of storage devices that store computer readable instructions for directing the operation of a digital computer. Preferably, the computer readable storage devices are compatible with the apparatus 600 illustrated in FIG. 6.

The computer readable storage device preferably comprises a first plurality of storage locations, wherein the first plurality of storage locations store instructions for receiving a plurality of templates, wherein each of the plurality of templates describes at least a partial behavior of the integrated circuit design for a respective instruction. The computer readable storage device also comprises a second plurality of storage locations, wherein the second plurality of storage locations store instructions for receiving a plurality of register models, wherein the plurality of register models describe the operation of a plurality of registers within the integrated circuit. The computer readable storage device also comprises a third plurality of storage locations, wherein the third plurality of storage locations store instructions for receiving a plurality of exception events, wherein each of the plurality of exception events corresponds to a potentially problematic operation of the hardware implementation of the integrated circuit design. The computer readable storage device also comprises a fourth plurality of storage locations, wherein the fourth plurality of storage locations store instructions for processing the plurality of templates, the plurality of register models, and the plurality of exception events to produce the instruction/data stream 214, wherein the instruction/data stream 214 includes a plurality of events, and wherein an execution of the instruction/data stream 214 by the hardware implementation verifies the operation of the hardware implementation. The computer readable medium may also have stored upon it instructions to perform the various other steps of the present invention as previously illustrated and described.

The above described preferred embodiments are intended to illustrate the principles of the invention, but not to limit the scope of the invention. Various other embodiments and modifications to these preferred embodiments may be made by those skilled in the art without departing from the scope of the following claims.

I claim:

1. A method for generating an instruction/data stream used to verify a hardware implementation of an integrated circuit design, the method comprising the steps of:

receiving a plurality of templates, wherein each of the plurality of templates describes at least a partial behavior of the integrated circuit design for a respective instruction;

receiving a plurality of register models, wherein the plurality of register models describe the operation of a plurality of registers within the integrated circuit design;

receiving a plurality of exception events, wherein each of the plurality of exception events corresponds to a potentially problematic operation of the hardware implementation of the integrated circuit design;

processing the plurality of templates, the plurality of register models, and the plurality of exception events to produce the instruction/data stream, wherein the instruction/data stream includes a plurality of events, and wherein an execution of the instruction/data stream by the hardware implementation verifies the operation of the hardware implementation.

2. The method of claim 1, wherein the plurality of events of the instruction/data stream operate sequentially without intermediate reinitialization of the plurality of registers.

3. The method of claim 1:

further comprising the step of receiving system element behavior, wherein system element behavior describes operation of system elements within the integrated circuit design; and wherein the step of processing the plurality of templates, the plurality of register models, and the plurality of exception events further includes processing the system element behavior.

4. The method of claim 3, wherein the system element behavior describes operations of system elements selected from the group consisting of at least memory management units, load/store units, cache memory units, receiver units, transmitter units, receiver/transmitter units, integer units, floating point units, coprocessors, arithmetic logic units, and input/output controllers.

5. The method of claim 1, wherein the plurality of register models includes a plurality of system register models and a plurality of general register models.

6. The method of claim 1, wherein the plurality of exception events includes a plurality of instruction based exception events and a plurality of hardware event based exception events.

7. The method of claim 1, wherein at least a plurality of the templates further include respective boundary conditions.

8. The method of claim 1, wherein the respective boundary conditions include operand values and pipeline sequences.

9. The method of claim 1, wherein the hardware implementation is selected from the group consisting of behavioral-level models, register-transfer-level models, resistor-transistor-level models, physical design file models, and silicon representations.

10. The method of claim 1, wherein processing includes, based upon user input:

generating a sequence of instructions to initialize the hardware implementation to an initialized state;

creating at least one instruction thread that verifies an operation of the hardware implementation for a respective template operating under a respective boundary condition; and creating at least one instruction thread that verifies contents of registers within the hardware implementation to verify the operation of the hardware implementation.

11. The method of claim 10, further comprising the step of creating instructions that cause the hardware implementation to compare actual resultants generated by the hardware implementation with expected resultants.

12. A method for generating an instruction/data stream used to verify a hardware implementation of an integrated circuit design, the method comprising the steps of:

receiving a plurality of templates, wherein each of the plurality of templates describes at least a partial behavior of the integrated circuit design for a respective instruction;

receiving a plurality of register models, wherein the plurality of register models describe the operation of a plurality of registers within the integrated circuit design;

receiving a plurality of exception events, wherein each of the plurality of exception events corresponds to a potentially problematic operation of the hardware implementation of the integrated circuit design;

generating a sequence of instructions that, when executed, initialize the hardware implementation to an initialized state;

generating a plurality of instructions that, when executed, perform verification of a partial state of the hardware implementation;

generating a plurality of instruction threads based on at least one template, at least one register model, and at least one exception event, that, when executed, verify a portion of an operation of the hardware implementation for a respective template, a respective boundary condition, and a respective exception event; and creating a plurality of instruction threads that, when executed, verify contents of registers within the hardware implementation.

13. The method of claim 12, further comprising the steps of:

receiving system element behavior, wherein system element behavior describes operation of system elements within the integrated circuit design; and generating a plurality of instruction threads based on the system element behavior that, when executed, verify a portion of an operation of the hardware implementation for a respective system element.

14. The method of claim 13, wherein the system element behavior describes operations of system elements selected from the group consisting of at least memory management units, load/store units, cache memory units, receiver units, transmitter units, receiver/transmitter units, integer units, floating point units, coprocessors, arithmetic logic units, and input/output controllers.

15. The method of claim 12, wherein the hardware implementation is selected from the group consisting of behavioral-level models, register-transfer-level models, resistor-transistor-level models, physical design file models, and silicon representations.

16. The method of claim 12, wherein the plurality of register models includes a plurality of system register models and a plurality of general register models.

17. The method of claim 12, wherein the plurality of exception events includes a plurality of instruction based exception events and a plurality of hardware event based exception events.

18. The method of claim 12, wherein the respective boundary conditions include operand values and pipeline sequences.

19. An apparatus for generating an instruction/data stream used to verify a hardware implementation of an integrated circuit design comprising:

a processor, wherein the processor processes instructions;

a processor bus operably coupled to the processor;

an input/output interface operably coupled to the processor bus, wherein the processor may control the flow of data through the input/output interface;

memory operably coupled to the processor bus for storing data and instructions, wherein the memory stores instructions for:

receiving a plurality of templates, wherein each of the plurality of templates describes at least a partial behavior of the integrated circuit design for a respective instruction;

receiving a plurality of register models, wherein the plurality of register models describe the operation of a plurality of registers within the integrated circuit design;

receiving a plurality of exception events, wherein each of the plurality of exception events corresponds to a potentially problematic operation of the hardware implementation of the integrated circuit design;

processing the plurality of templates, the plurality of register models, and the plurality of exception events to produce the instruction/data stream, wherein the instruction/data stream includes a plurality of events, and wherein an execution of the instruction/data stream by the hardware implementation verifies the operation of the hardware implementation.

20. A computer readable storage device adapted for use with a digital computer such that the digital computer may read the computer readable storage device, wherein the computer readable storage device comprises:

(a) a first plurality of storage locations, wherein the first plurality of storage locations store instructions for causing the digital computer to receive a plurality of templates, wherein each of the plurality of templates describes at least a partial behavior of the integrated circuit design for a respective instruction;

(b) a second plurality of storage locations, wherein the second plurality of storage locations store instructions for causing the digital computer to receive a plurality of register models, wherein the plurality of register models describe the operation of a plurality of registers within the integrated circuit design;

(c) a third plurality of storage locations, wherein the third plurality of storage locations store instructions for causing the digital computer to receive a plurality of exception events, wherein each of the plurality of exception events corresponds to a potentially problematic operation of the hardware implementation of the integrated circuit design;

(d) a fourth plurality of storage locations, wherein the fourth plurality of storage locations store instructions for causing the digital computer to process the plurality of templates, the plurality of register models, and the plurality of exception events to produce the instruction/data stream, wherein the instruction/data stream includes a plurality of events, and wherein an execution of the instruction/data stream by the hardware implementation verifies the operation of the hardware implementation.

* * * * *